US006971054B2

(12) United States Patent
Kurtulik et al.

(10) Patent No.: US 6,971,054 B2
(45) Date of Patent: *Nov. 29, 2005

(54) METHOD AND SYSTEM FOR DETERMINING REPEATABLE YIELD DETRACTORS OF INTEGRATED CIRCUITS

(75) Inventors: Raymond J. Kurtulik, Cornwall-on-Hudson, NY (US); Franco Motika, Hopewell Junction, NY (US); Richard F. Rizzolo, Red Hook, NY (US)

(73) Assignee: International Business Machines Corporation, Armonk, NY (US)

( * ) Notice: Subject to any disclaimer, the term of this patent is extended or adjusted under 35 U.S.C. 154(b) by 629 days.

This patent is subject to a terminal disclaimer.

(21) Appl. No.: 10/138,992

(22) Filed: May 2, 2002

(65) Prior Publication Data

US 2002/0125907 A1     Sep. 12, 2002

Related U.S. Application Data

(63) Continuation-in-part of application No. 09/722,880, filed on Nov. 27, 2000, now Pat. No. 6,751,765.

(51) Int. Cl.[7] .......................... G01R 31/28; G11C 29/00
(52) U.S. Cl. ....................................... 714/732; 714/732
(58) Field of Search ................................ 714/724, 726, 714/727, 728, 732, 736–738, 718, 723; 365/201

(56) References Cited

U.S. PATENT DOCUMENTS

| | | | | |
|---|---|---|---|---|
| 3,761,695 A | | 9/1973 | Eichelberger | 235/153 |
| 4,503,536 A | * | 3/1985 | Panzer | 714/732 |
| 5,515,384 A | * | 5/1996 | Horton, III | 714/732 |
| 5,727,000 A | * | 3/1998 | Pizzica | 714/737 |
| 5,925,144 A | | 7/1999 | Sebaa | 714/733 |
| 5,930,270 A | * | 7/1999 | Forlenza et al. | 714/736 |
| 5,938,784 A | | 8/1999 | Kim | 714/733 |
| 5,983,009 A | | 11/1999 | Lepejian et al. | 395/500.19 |
| 5,983,380 A | | 11/1999 | Motika et al. | 714/733 |
| 6,012,157 A | | 1/2000 | Lu | 714/741 |
| 6,021,514 A | | 2/2000 | Koprowski | 714/733 |
| 6,202,181 B1 | * | 3/2001 | Ferguson et al. | 714/724 |
| 6,442,723 B1 | * | 8/2002 | Koprowski et al. | 714/732 |
| 6,557,132 B2 | * | 4/2003 | Gangl et al. | 714/736 |
| 6,643,807 B1 | * | 11/2003 | Heaslip et al. | 714/719 |
| 6,725,403 B1 | * | 4/2004 | Schmoelz | 714/723 |

OTHER PUBLICATIONS

"Efficient Implementation of Multiple On-Chip Signature Checking" Abdulla et al. 10th International Conference on VLSI Design Publication Date: Jan. 4-7, 1997 pp. 297-302 Inspec Accession No.: 5565767.*

(Continued)

Primary Examiner—Albert Decady
Assistant Examiner—Cynthia Britt
(74) Attorney, Agent, or Firm—Lynn Augspurger; Cantor Colburn LLP

(57) ABSTRACT

An exemplary embodiment of the present invention is a method for testing an integrated circuit. The method includes generating a test pattern and generating a reference signature corresponding to the test pattern. An integrated circuit test is executed in response to the test pattern and a result signature is generated in response to data output from executing the integrated circuit test. The result signature is compared to the reference signature and a current failing signature is created if the two don't match. The current failing signature is copy of the result signature. Common error analysis is executed in response to creating the current failing signature. Additional embodiments include a system and storage medium for testing an integrated circuit.

37 Claims, 7 Drawing Sheets

OTHER PUBLICATIONS

"Predicting Failing Bitmap Signatures for Memory Arrays with Critical Area Analysis" Segal et al. Advanced Semiconductor Manufacturing Conference and Workshop, 1999 IEEE/SEMI Publication Date: Sep. 8-10, 1999 pp. 178-182 Inspec Accession No.: 6512794.*

"Maximization of Self-Test Coverage in a Hardware Design", IBM Technical Disclosure Bulletin, vol. 35 No. 1A, Jun. 1992.

"A Logic Design Structure For LSI Testability", E.B. Eichelberger and T.W. Williams, Proceedings of the 14th Design Automation, New Orleans, pp. 462-468, 1977.

"Self-Testing Of Multichip Logic Modules", P.H. Bardell and W.H. McAnney, Proceedings of the IEEE International Test Conference, pp. 200-204, 1982.

* cited by examiner

US 6,971,054 B2

METHOD AND SYSTEM FOR DETERMINING REPEATABLE YIELD DETRACTORS OF INTEGRATED CIRCUITS

CROSS REFERENCE TO RELATED APPLICATIONS

This is a continuation-in-part of U.S. patent application Ser. No. 09/722,880, filed Nov. 27, 2000, now U.S. Pat No. 6,751,765, the entire contents of which are incorporated herein by reference.

BACKGROUND OF THE INVENTION

This invention relates to the testing of logic systems in semiconductor integrated circuits or chips. More specifically, the invention relates to a method and apparatus for more easily identifying common causes of logic circuit yield detractors. An alternate embodiment relates to a method and apparatus for more easily identifying common causes of integrated circuit yield detractors.

Yield is the ratio of all good chips to the total number of chips produced. It is an extremely important quantity and often determines if a program is highly profitable or a loss. A major effort in the development of a new semiconductor technology is termed "yield learning." Yield learning covers all activities to raise yield to volume manufacturable levels. Yield detractors include process random defects, process systematic problems, mask defects or problems, and circuit marginality problems. Many of these problems have random characteristics, that is, they occur in different areas of the chip and on different circuits without any apparent pattern. This is the usual characteristic when a process is mature. As long as the defect level is sufficiently low it is acceptable. High random defect levels are a serious concern and usually indicate a more systematic problem such as contamination Regular structures such as memory arrays and test structures built on the kerf (the space on the wafer between chips) serve as monitors for high random defect levels. There are other systematic, or repeatable, yield detractors that are more difficult to diagnose. These are problems that occur in the logic area of the chip. They may be caused by circuit marginality, mask defects, or process marginality for structures unique to logic. If these problems cause very low yield, there is a great effort undertaken to determine the cause and fix the problem. If the yield loss is low, however, or only occurs on certain lots, it may be interpreted as expected random defects. "Low" yield loss is relative to the size of the chip, the complexity of the process, and the maturity of the process. If "expected" yield is 20% and the actual yield is 16%, the difference may be attributed to random defects, when in fact it may be due to systematic defects with a common cause that may be much more easily fixed.

Chips are tested by applying a sequential set of electrical voltage levels to chip inputs and storage elements that represent logical '1' and '0'. After the appropriate clocking signals to activate the storage elements, those storage elements and the chip outputs are sampled and compared to the expected logical value. Access to the internal storage elements may be done via a scan configuration (e.g., LSSD).

As the complexity of chips increase, there is increasing demand on the test system to store the necessary '1' and '0' confirmations to apply as stimulus on the inputs and expected values are the outputs to compare against. The term 'input' in this context means whatever elements the local stimulus is applied to, either physical chip inputs or storage elements accessible by some scan method such as LSSD.

There are two methods of reducing the storage requirements of these so-called "test patterns". One method is to compress all the measurements sequentially into a set of storage elements known as Multiple Input Shift Register or MISR. The MISR value or signature is measured at the end of the test, which may be thousands of clock cycles or more, and compared with its expected value. Another method, known as Logic Built In Self Test or LBIST uses a structure known as a Pseudo Random Pattern Generator or PRPG, generates the stimulus in a pseudo random fashion. After the application of the pseudo random pattern and a set of functional clock cycles the results are compressed in a MISR.

In the existing state of the art, repeatable defects could be inferred if the same test patterns failed on multiple chips and especially if the same elements failed on those patterns. In a test that comprises, for example, 1,000 patterns, if test #512 fails on a number of parts, then repeatable defects are highly suspect. The existing state of the art has practical limitations. In practice, much of the chip is tested in the first few patterns so it is natural that earlier patterns will have a higher failure rate and the vast majority of these will not be common fails. If the individual outputs are counted, there is more resolution of the failure. For example, if multiple chips failed in a way that on pattern 5, output 572 as a '1', then this would more definitively point to a repeatable defect as the cause of the failure.

There are still limits to the usefulness of this method, however, because there are on large chips tens or hundreds of thousands of outputs (chip outputs and latches) that are measured. It is impractical to compare all the possible failure modes for thousands of latches on thousands of patterns across thousands of chips.

Yet one more limitation of the existing method is that it is not applicable to any test that compresses measurements into a register after every cycle. This is critical, because such test methodologies, such as LBIST are increasingly used to test advanced chips.

Selective signature generation can be used to provide dynamically selectable signature generation modes that can be used to isolate and/or diagnose faults on BIST circuits. Selective signature generation can be performed as described in U.S. patent application Ser. No. 09/310,445, filed on May 12, 1999 which is incorporated herein by reference in its entirety.

SUMMARY OF THE INVENTION

An exemplary embodiment of the present invention is a method for testing an integrated circuit. The method includes generating a test pattern and generating a reference signature corresponding to the test pattern. An integrated circuit test is executed in response to the test pattern and a result signature is generated in response to data output from executing the integrated circuit test. The result signature is compared to the reference signature and a current failing signature is created if the two don't match. The current failing signature is copy of the result signature. Common error analysis is executed in response to creating the current failing signature. Additional embodiments include a system and storage medium for testing an integrated circuit.

DETAILED DESCRIPTION OF THE INVENTION

Figure 1:
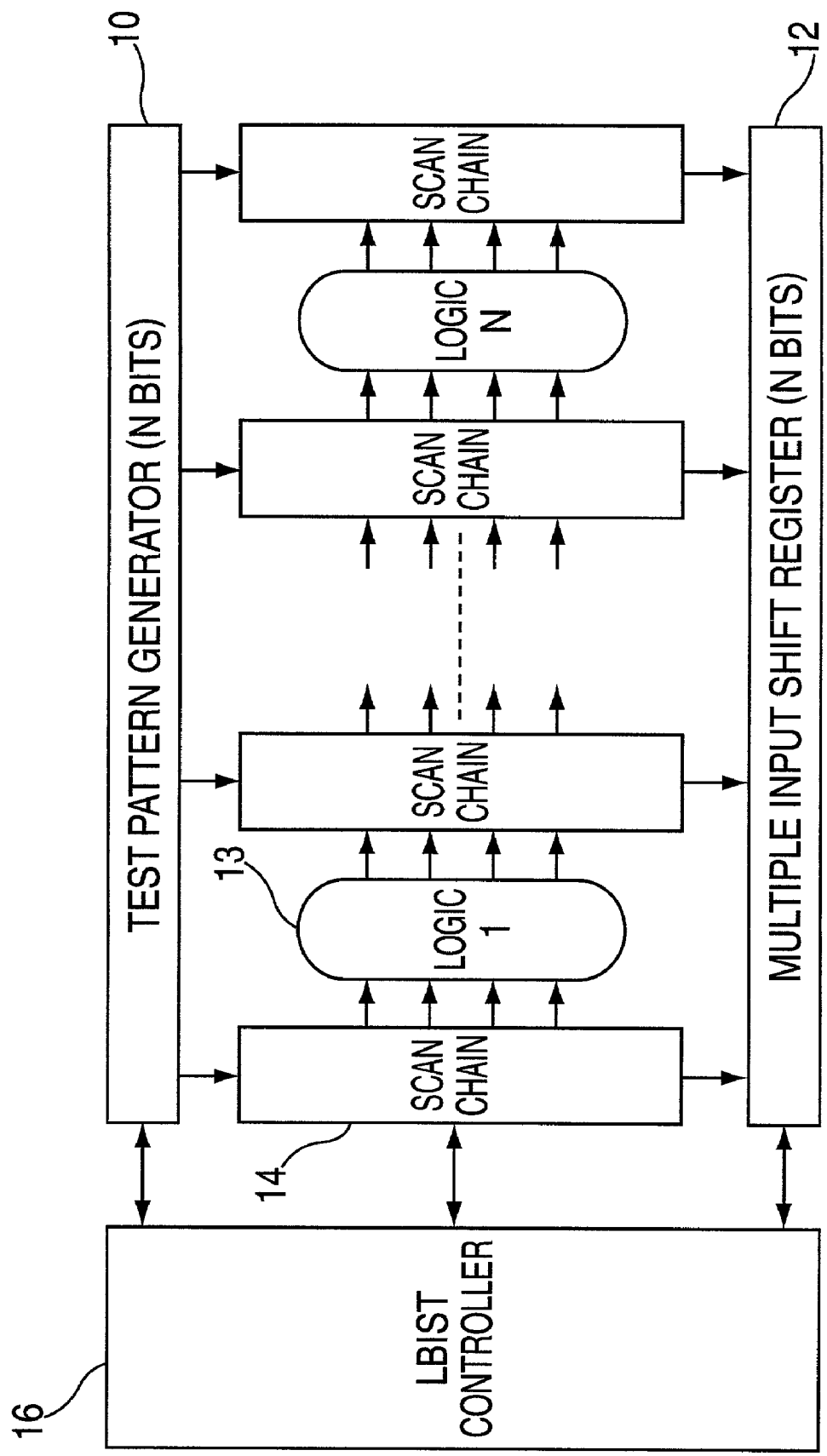
FIG. 1 is a block diagram of a LBIST system in an exemplary embodiment of the invention.

FIG. 1 shows a high-level overview of the chip LBIST implementation for LBIST testing chip logic with the use of a test pattern generator 10 which is used to generate the test patterns passing through a scan chain 14 to a multiple input signature register (MISR) 12 to compress the test results. An LBIST controller 16 is used to apply the clocks and controls to the test pattern generator, MISR and system logic to perform the test. The test pattern generator 10 of FIG. 1 generates test data which passes through logic via multiple parallel scan chains 14 which are connected between the test pattern generator and MISR 12. The test pattern generator 10 having N bits generates the test data which is scanned into the scan chains 14 as the test pattern for the scan operation portion of the LBIST test of the chip. Clock signals are applied to the logic 13 and the result of the test pattern and logic 13 is scanned out of the scan chains 14 and compressed and stored into the MISR 12 to generate a test signature. The chip is partitioned into N sections of logic 13 which are fed by any of the N scan chains 14. An LBIST controller 16 (e.g., a microprocessor executing control program) controls the LBIST sequencing by applying the appropriate clocks, comparing the test signature in the MISR 12 to reference signatures to detect a failure and detecting common failing signatures as described herein.

A complex chip may have several MISRs, each containing dozens of bits. After every clock cycle, the new measurements are compressed into each MISR. At the end of the test, several hundred thousand or more test cycles, each containing ten thousand or more measures, are compressed into an exemplary signature of 4×61 bits. If that signature matches the expected signature generated, for example, by a simulation, then the chip is considered to have passed the test. If at least one measure is wrong for any one pattern, the signature will not match and the chip will be labeled as a "fail".

Measures map nearly uniquely into a given signature. If two chips have "bad" signatures that match, it usually means that both chips failed exactly the same outputs in the same way on exactly the same patterns. Because of this, matching failing signatures are a reliable indicator of a common systematic failure mechanism.

Figure 4A:
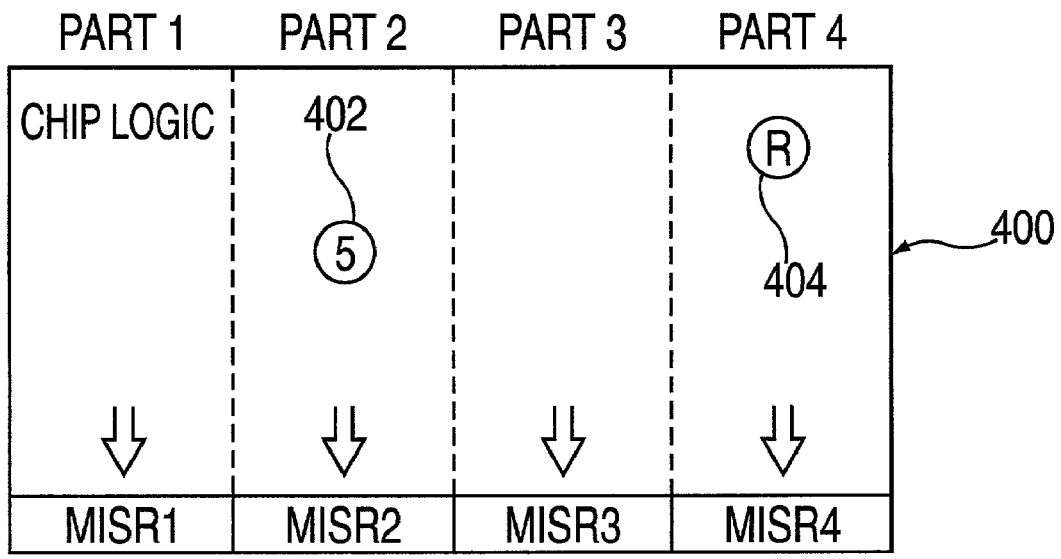
FIGS. 4A and 4B depict exemplary partitioned multiple partitioned shift registers.
Figure 4B:
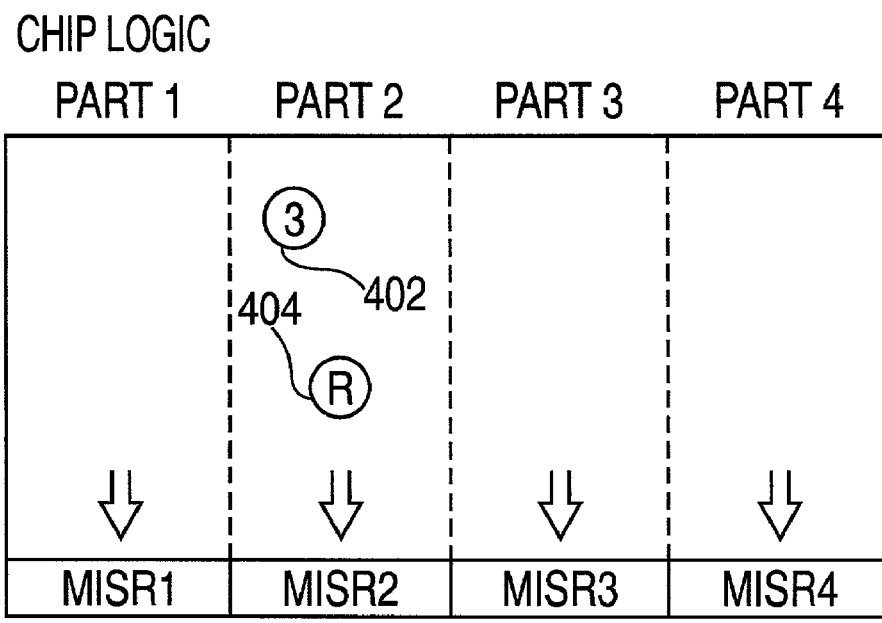

For large chips in an advanced semi-conductor process in development, it is not unusual for the random defect level to be very high. Yields may be 5% or even less than 1%. A partitioning method is used to enhance the detection of systematic defects. Assume that a common mode or systematic logic defect is present on 10% of all chips, assume also that random logic defects occur on 98% of all chips. In that case, a total of 1,000 chips would need testing to get 20 good chips of which 2 may show the common mode failing signature. Assume that the systematic fail is first detected after n patterns. The number n is quite often small, often less than 100 because most of the chip is tested by early patterns. Furthermore, assume that there are multiple MISRs (MISR1, MISR2, MISR3 and MISR4) and the systematic fail only affects MISR2. FIGS. 4A and 4B depict an exemplary chip 400 partitioned into four sections. A systematic defect 402 and a random defect 404 are depicted. In this case, the systematic defect 402 in pattern n in MISR 2 can be resolved from the random defect 404:

(1) if the random defect 404 affects only MISRs 1, 3, 4, not 2 (as shown in FIG. 4A), or (2) if the random defect 404 is first tested in MISR 2 on pattern n+1 or greater (as shown in FIG. 4B) i.e., the random defect 404 if first tested later than the systematic defect 402.

To enhance detection of systematic defects in the presence of noise, MISRs from multiple chips are compared, not only for the final pattern count but for smaller pattern counts as well. Like MISRs compared on the same pattern count for multiple patterns. If any match, these chips are highlighted as common mode fails. In the example given, it is likely that 75% of the defects will occur on logic feeding a different MISR, and 50% of the defects will occur on patterns after the systematic fail. In that case, 87.5% (75%+50%×25%) of the systematic defects would be distinguishable from random defects. In that case, only about 30 chips need to be tested to identify a systematic defect (10%×30×87.5%) showing up on two different chips.

Pattern partitioning aids in detecting systematic defects that have marginal or intermittent behavior. Small changes in voltage, temperature, resistance, etc. may change a "fail" to a pass. The same defect may affect 10 bits of a 32 bit bus on one chip, 12 bits on a second chip, and 13 bits on a third chip. Pattern partitioning also helps identify marginal systematic fails. An exemplary method of partitioning the LBIST pattern set uses test coverage information based on fault simulation.

Figure 2:
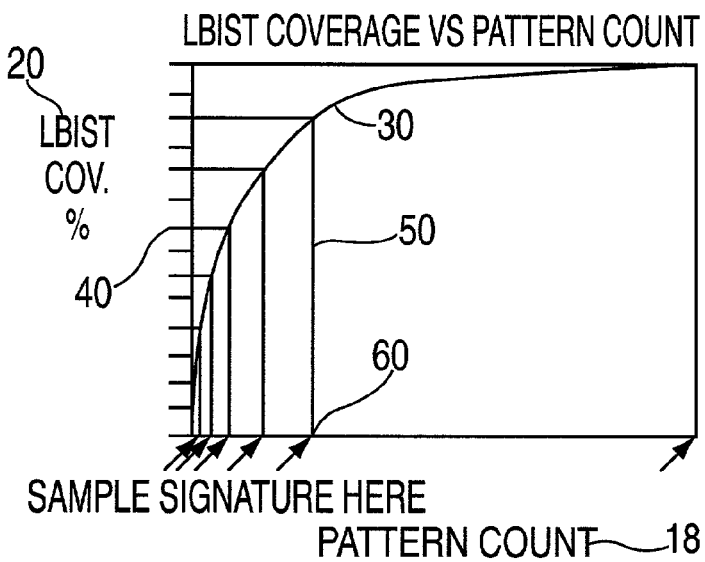
FIG. 2 illustrates a way to partition the tests.

FIG. 2 is a graph of LBIST coverage percentage 20 versus the pattern count 18 for an exemplary integrated circuit. The curve 30 may be obtained from the pattern simulation. As seen in FIG. 2, on the vertical axis equal intervals 40 of LBIST coverage are indicated. Where these intervals intersect the curve 30 is where the test should be partitioned 50. Notice there are more partitions 50 at lower pattern counts 18 because the coverage 20 increases so quickly. The number of partitions 50 is most likely limited by practical considerations such as complexity of test program and test time.

Many parts have coverage curves that resemble FIG. 2. An alternative way of specifying pattern boundaries or defining the intersect curve 30 is at every $2^n$ patterns from n=0 to the end of the test. Since LBIST tests lengths are usually a multiple of 2, the last boundary is at the end of the test. For example, a 4K pattern test would be divided into 13 partitions.

Figure 3:
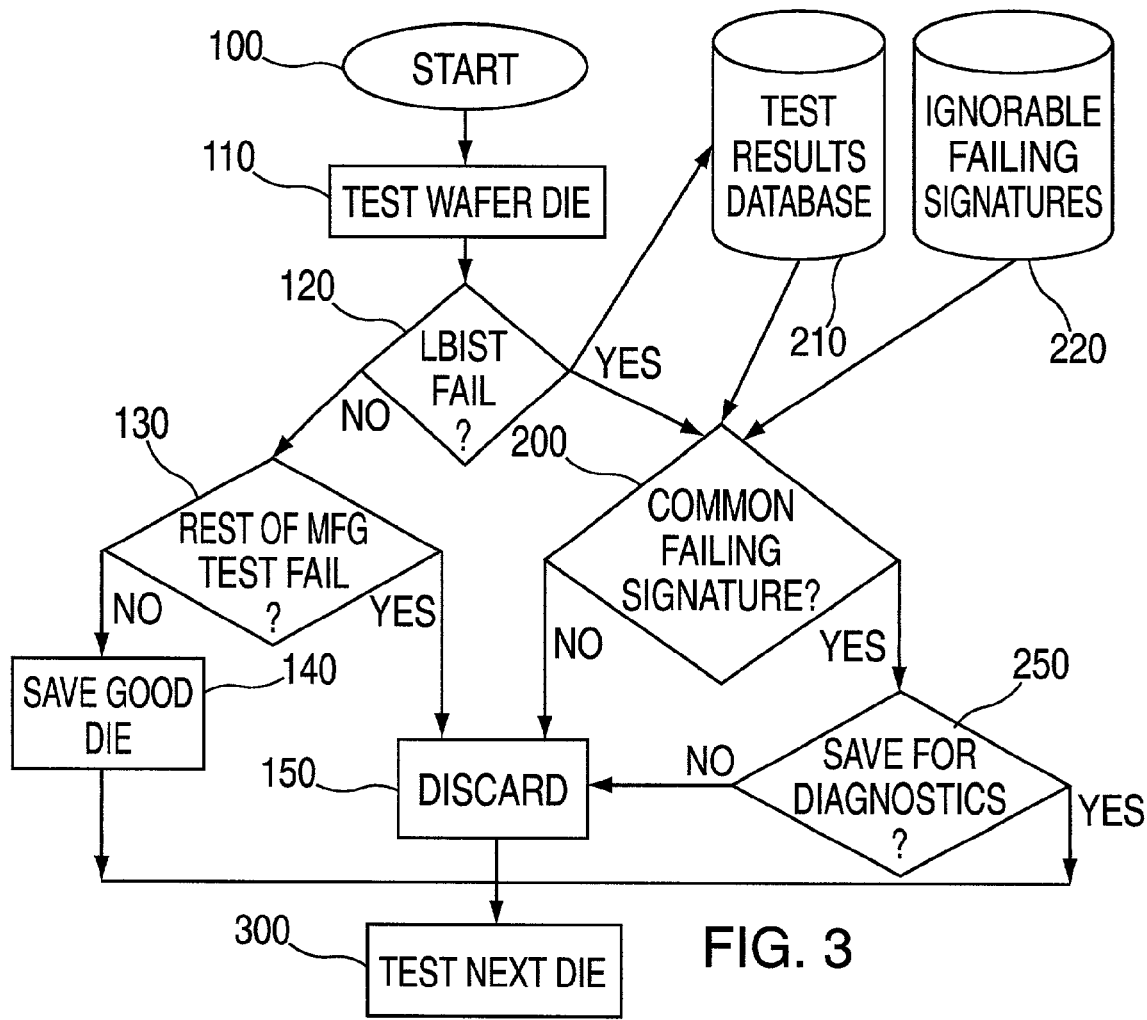
FIG. 3 shows a flowchart of an exemplary process for finding common failing signatures in LBIST devices.

FIG. 3 is a flowchart of an exemplary process for testing integrated circuits. To begin the process, an LBIST test of a chip 110 is initiated at 100. The test patterns can be divided into a number of partitions 50, and the signature 125 is checked at the end of each partition 50. The tests are ordered such that the smallest partitions are tested first. At step 120, it is determined whether the device under test has failed. This is determined by applying the test pattern partitions in order and comparing the signature to a reference signature. For example, a first test pattern partition is applied to the chip under test and a first signature is compared to a first reference signature. Then, a second test pattern partition is applied to the device under test and a second signature is compared to a second reference signature. When a signature has a mismatch occur for a test, that failing signature is saved in a record of a test database 210 containing reference failing signatures. The failing record is indexed by a unique identifier for the chip, such as an electronic chip ID. Practical considerations, such as the size of the database may limit the number of bits of the signature that are saved. A limited signature is acceptable as long as the probability of aliasing is small. Most likely, ten or fewer bits may be saved of the MISR. Saving mismatches from the expected MISR is also acceptable, because common mode failures can be just as easily extracted from that data. Finally, only the first failing signature within each partition 50 (or equivalent) may be saved.

The more conditions under which this partitioned test is run, the more potential for determining marginal or ignorable common fails stored in database 220. Such conditions include high and low specified voltage corners, running the test at DC or at speed, etc. Additionally, other conditions can be considered such as high and low temperature. An identifier in the database record 210 to identify the failing test condition is useful but not necessary.

If failing signatures are found at step 120, flow proceeds to step 200 where the process determines the existence of common failing signatures which indicate a non-random source of failure such as process defects. Failing signatures for the chip under test 110 are compared by a LBIST controller 16 against all reference failing signatures in database 210. Only signatures of identical tests may be compared. For example, if an LBIST test of 32 patterns (LBIST_32) fails, it is to be compared against the identical 32 pattern long LBIST test signature for other chips. The signature may be compared across environmental conditions but caution must be exercised or a common fail may not be found. For example, if a chip fails LBIST_32 at low voltage and it is only compared with other chips failing LBIST_32 at low voltage, then a common failing signature may not be found. It may be that there is a chip that failed with the same signature at nominal voltage and another characteristic (intrinsic chip speed for example) made it pass at low voltage. Queries should be broad, across all environmental conditions for the same test.

Chips that do not fail the LBIST tests will generally also be tested at step 130 for other manufacturing defects. If they fail these subsequent tests 130 they are generally discarded at step 150. Prior to being discarded, a description of the manufacturing defect may be maintained for overall evaluation of the manufacturing process. After discarding a chip, the testing can begin again on another chip at 300 if one is available. Chips that pass the manufacturing tests can be saved as shown at 140.

At step 200, if there are no common failing signatures, flow proceeds to step 150 and the device under test is discarded as being a failing chip. If a failing signature of one chip matches a failing signature of another chip that indicates that some non-random failure mechanism is taking place. Flow proceeds to step 250 where the device under test can be saved for diagnostics or discarded. Even if the incidence is low, there is a concern because whatever caused the problem may become much worse when the next semiconductor lot is tested or if the test specifications change slightly. One of the problems of highest concern is circuit marginality. Circuit behavior may be marginal at voltage, temperature, or cycle time limits. This behavior must be identified quickly so that fixes can get into the next release of the chip. Yield may be acceptable for one lot, but unacceptably low for the next lot.

Some signatures may be common but indicate either a catastrophic problem or normal behavior. These signatures are stored in a database 220 of ignorable failing signatures and should be treated separately and not usually considered part of the common mode fail search. An example of a catastrophic problem would be poor electrical contact to a chip lead required for LBIST. Another would be the LBIST state machine never starts and the signature is trivial. Normal behavior may be a defect free response caused by a circuit that failed in an expected manner. An example of this would be caused by running LBIST at shorter and shorter cycle times exceeding the chip specification until a fail occurs. This "fail" may be caused by predicted timing critical paths on the chip. Since chips of a given type are all designed the same, it is to be expected that many chips will have the same critical path failing, resulting in the same failing signature. As a minimum, common failing signatures need to be identified so the yield loss due to them can be quantified. It is recommended that chips with common fails be saved for further diagnostic work to determine the root cause and identify fixes. With this invention, chips that have common logic problems can be easily identified. The relative yield loss attributable to each common problem can be calculated and the chips set aside for further diagnostic analysis to determine root cause and fix.

Figure 5:
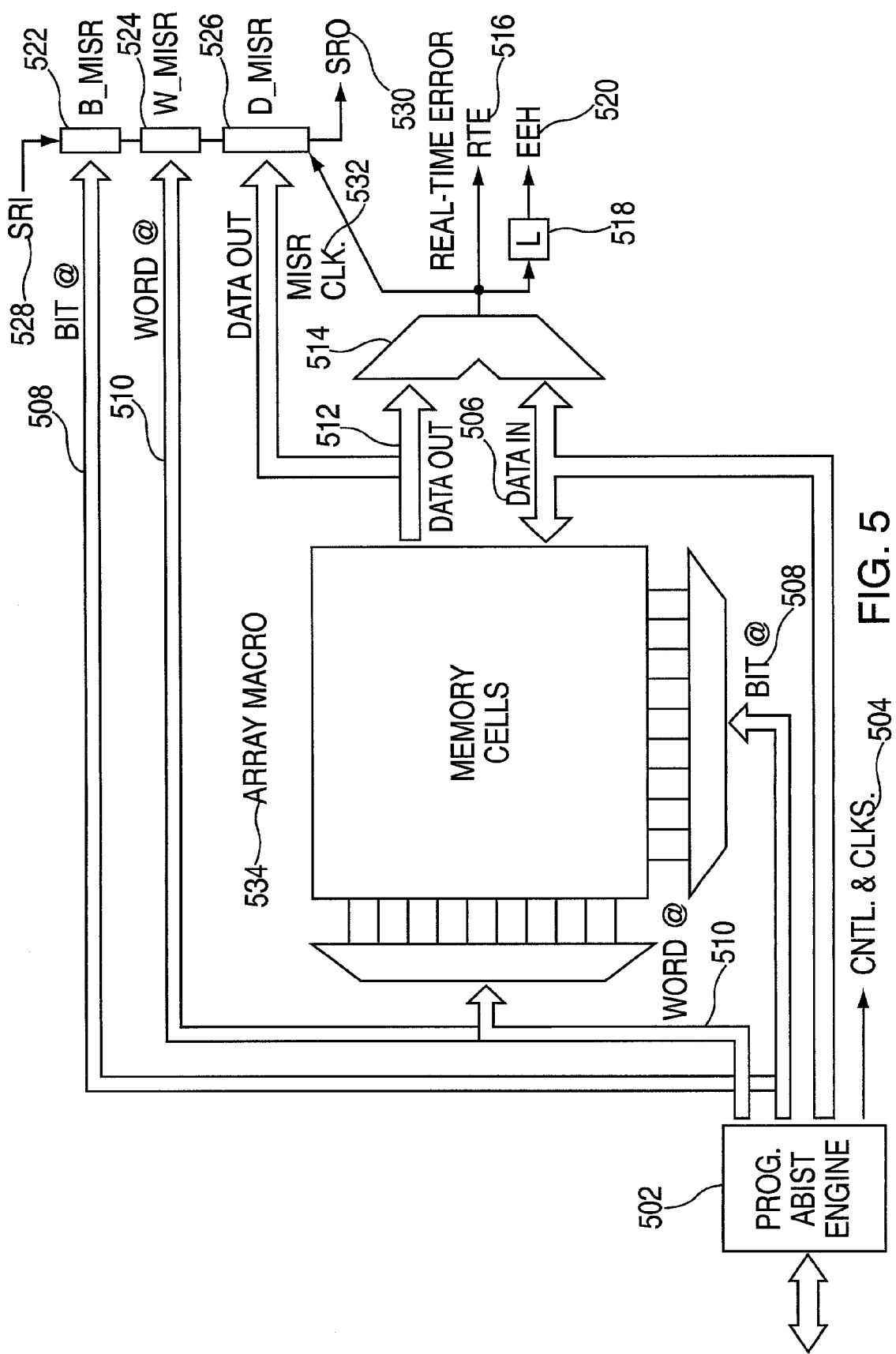
FIG. 5 is a block diagram of an exemplary dedicated ABIST test configuration with common mode MISRs.

FIG. 5 is a block diagram of an exemplary dedicated ABIST test configuration with common mode MISRs that can be used to identify common failures. This embodiment includes a dedicated ABIST test configuration with the addition of MISRs for each of the critical busses, and a MISR clock 532 to capture the data into the additional MISRs. In general, dedicated ABIST test configurations can be used for large arrays that require redundant address capability to work-around cells that are defective. One function of the ABIST engine 502 is to generate data to test the array 534, including word addresses 510, bit addresses 508, and clock and control signals 504. Data-in 506 and expected-data-out may be multiplexed on the same bus 506 or on individual busses 512 as shown in FIG. 5. Various algorithms programmed into the ABIST engine 502 supply different data-in or test patterns and address stepping sequences to the array 534. At specific array read times, expected-data-out is compared, using a compare circuit 514, with the array contents. If there is a miscompare, the failing address is stored and error signals are generated. In an exemplary embodiment, the signal "Real-Time Error" (RTE) 516 is active only during the time that the expected-data-out and data-out 512 mismatch. The signal "Error Ever Happen" (EEH) 520 is a latched version of RTE 516. EEH 520 is set and held by a latch 518 if an expect-data-out to data-out 512 miscompare is detected. Serial "Shift Register Input" (SRI) 528 is input to the MISRs and "Shift Register Output" (SRO) 530 is output from the MISRs.

As shown in FIG. 5, an exemplary embodiment of the present invention includes an MISR being added to each of the array critical busses. In the configuration depicted in FIG. 5, the array critical busses include the bit address bus 508, the word address bus 510, and the data-out bus 512. The embodiment shown in FIG. 5 includes each critical address bus having an independent MISR: the bit address bus 508 sends data to the B_MISR 522; the word address bus 510 sends data to the W_MISR 524; and the data-out bus 512 sends data to the D_MISR 526. An alternate embodiment of the present invention includes two MISRS, one for the address bus (508, 510) and one for the data out bus 512.

Another alternate embodiment includes using selective signature generation to gate specific bits of the busses into each MISR. For example, selective signature generation may be used when it is known that particular bits are defective for a reason or when a test is focused on particular bits of the bus or particular cycles of the test or a combination of these.

Figure 8:
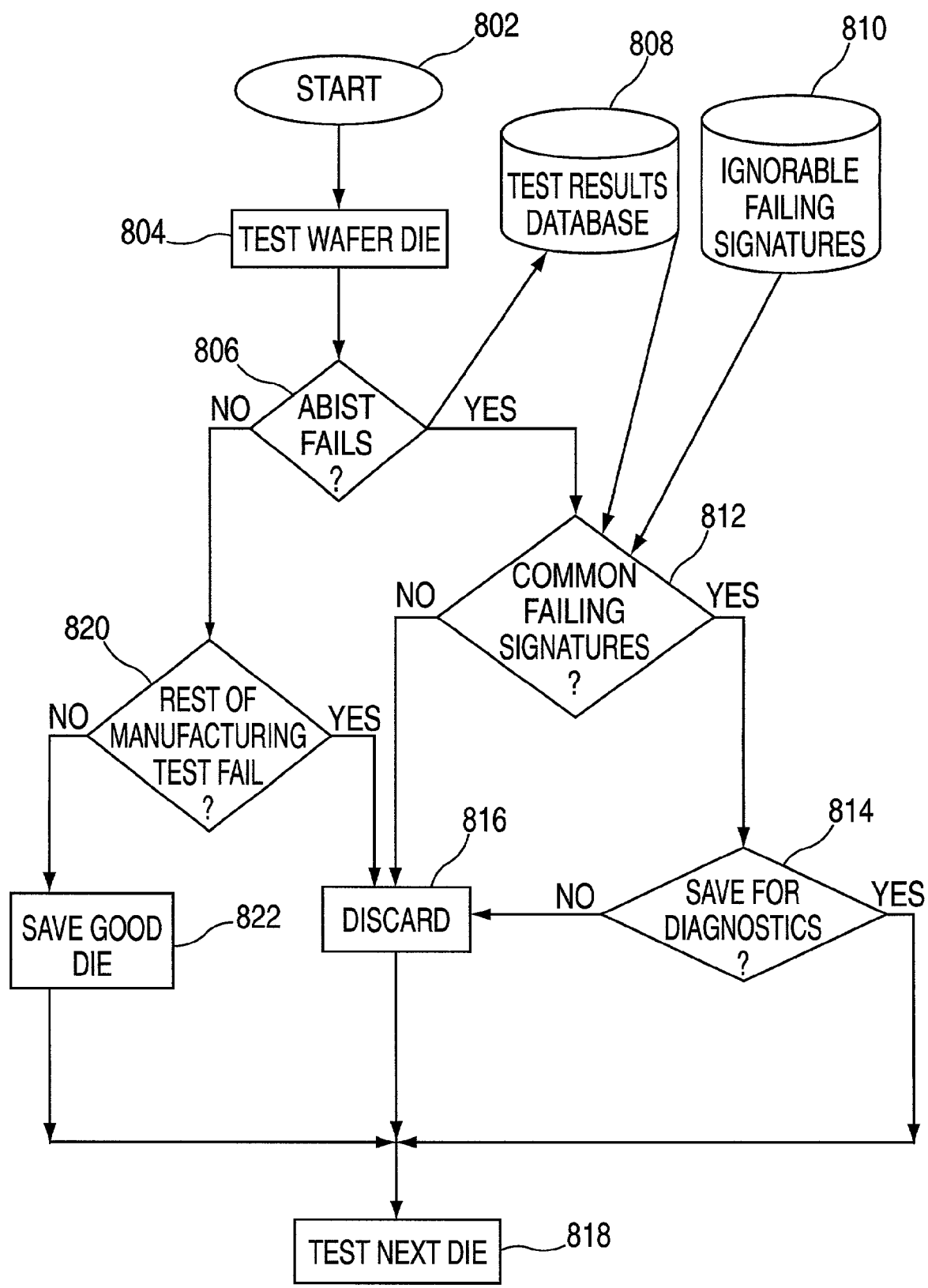
FIG. 8 is a flowchart of an exemplary process for finding common failing signatures in ABIST devices.

In an exemplary embodiment of the present invention, the three MISRs (522, 524, 526) depicted in FIG. 5 are clocked or shifted whenever a RTE 516 is detected at the output of the array. Alternatively, the MISRs can be clocked or shifted on every cycle or when a RTE 516 is detected in pre-selected subsections of the array. The MISRs (522, 524, 526) can be configured as part of an ABIST scan chain and clocked into an LBIST MISR 12 such as the one described previously in reference to FIG. 1. The algorithm described above in reference to LBIST common mode signature analysis, as depicted in FIG. 3, can be used to determine if a repeatable array fail is present. The process depicted in FIG. 3 compares failing signatures from a current test ("current failing signatures") of an integrated circuit to failing signatures from previous tests ("previous failing signatures") to determine the existence of a common failing signature. FIG. 8, described later in this specification, depicts an ABIST failing signature analysis method that is the ABIST version of the LBIST common mode signature analysis method depicted in FIG. 3. Using an ABIST common failing signature analysis method, as described below in reference to FIG. 8, allows utilization of the same software analysis code used by the LBIST. In an alternative embodiment, the signatures are read out directly from the MISRs (522, 524, 526) and not clocked into an LBIST MISR 12. The signatures can then be analyzed to determine if a failing signature includes an error that has been found in other previously tested chips (i.e. is the failing signature a common failing signature) using the process described below in reference to FIG. 8.

A benefit to generating an independent error signature for each of the array critical busses is that a common mode signature can be easily detected. Relatively simple analysis of the individual error signatures can be used to identify the type of common mode errors such as individual cell problems, bit-line problems, or word-line problems without extensive full bit-map analysis. An additional benefit can occur in the case where arrays support redundancy and the ABIST engine has identified what addresses are failing for eventual repair via fuse blowing.

Figure 6:
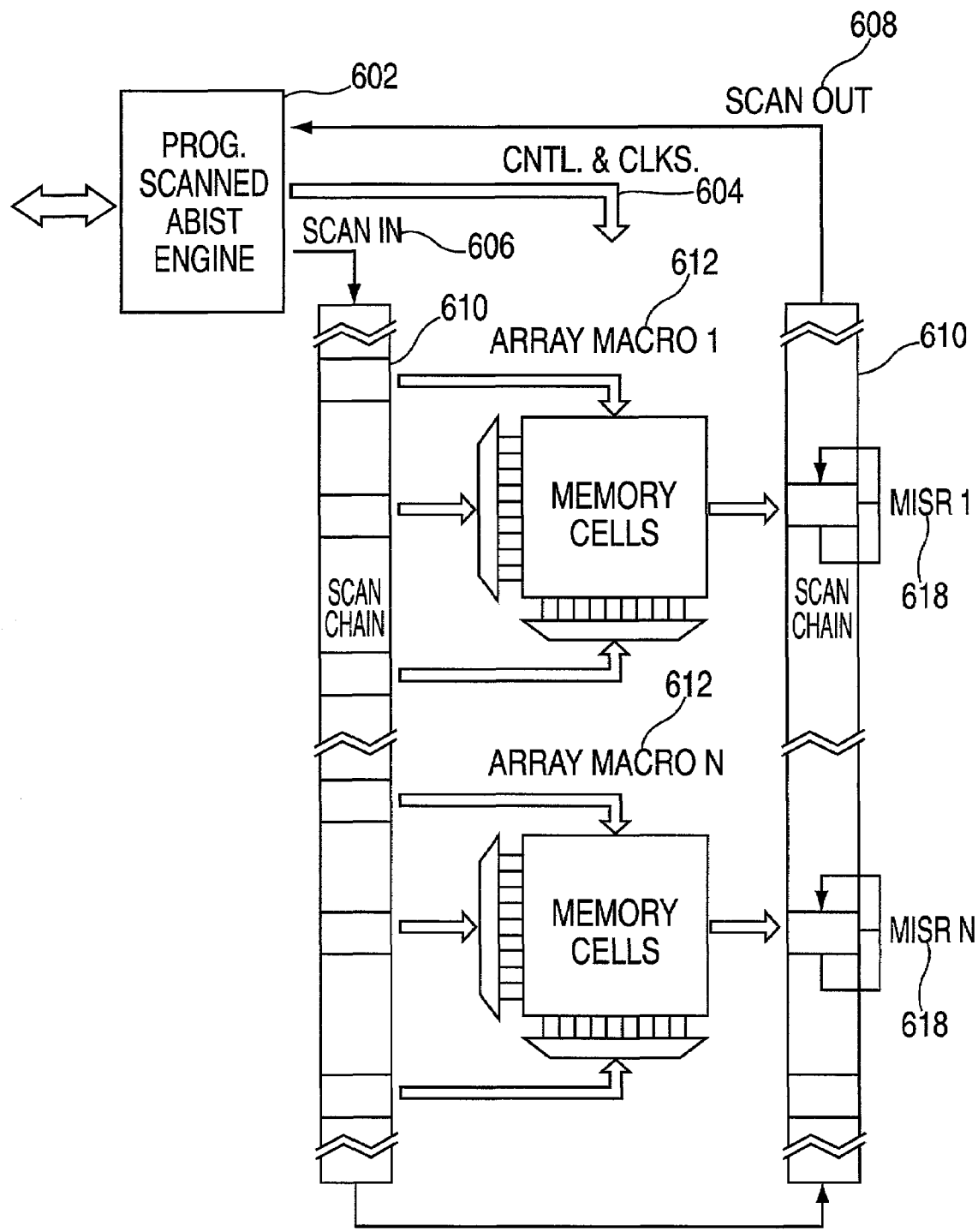
FIG. 6 is a block diagram of an exemplary scanned ABIST test configuration.

FIG. 6 is a block diagram of an exemplary scanned ABIST test configuration. A single ABIST engine 602 may drive multiple arrays 612. In the embodiment depicted in FIG. 6, the ABIST engine 602 generates word addresses, bit addresses, data-in, clocks and controls 604, as a serial stream of bits and shifts the data to the appropriate arrays via the scan chain. As shown in the exemplary embodiment depicted in FIG. 6 the data out of each array is captured in individual MISRs 618. Various algorithms programmed into the ABIST engine can supply different data-in patterns and address stepping to the array 612. In order to test multiple arrays 612, the scan chain 610 is reconfigured during scan ABIST mode to a shorter array sub-chain with only the necessary data and address bits to be scanned in 606 for each array on it the array sub-chain. A single operation performed on all arrays, for example a write, requires that the entire sub-chain be scanned with the address and data-in patterns for each array 612. The controls and write clock 604 are activated once the scan in 606 address and data are set up, and all arrays 612 are written simultaneously. The entire sub-chain is then reloaded serially by the ABIST engine 602 to set up for the next array operation.

In an exemplary embodiment, the arrays are largely independent of each other, and some arrays 612 may be read as others are being written. The data-out register from each array 612 feeds a dedicated MISR 618 forming an accumulated signature representing the compressed output data from that array 612. The MISRs 618 for each array 612 are in the ABIST sub-chain. The MISRs 618 may be checked at any point in the test, since every operation involves a full scan-in 606/scan-out 608 of the ABIST sub-chain. In an exemplary embodiment, the MISRs 618 are checked at the end of the test. After the test is complete, the actual signature in each MISR 618 is scanned out 608 and compared with a simulated reference signature for each array 612 to verify that it functioned correctly. This implementation can be referred to as a scanned MISR ABIST.

Figure 7:
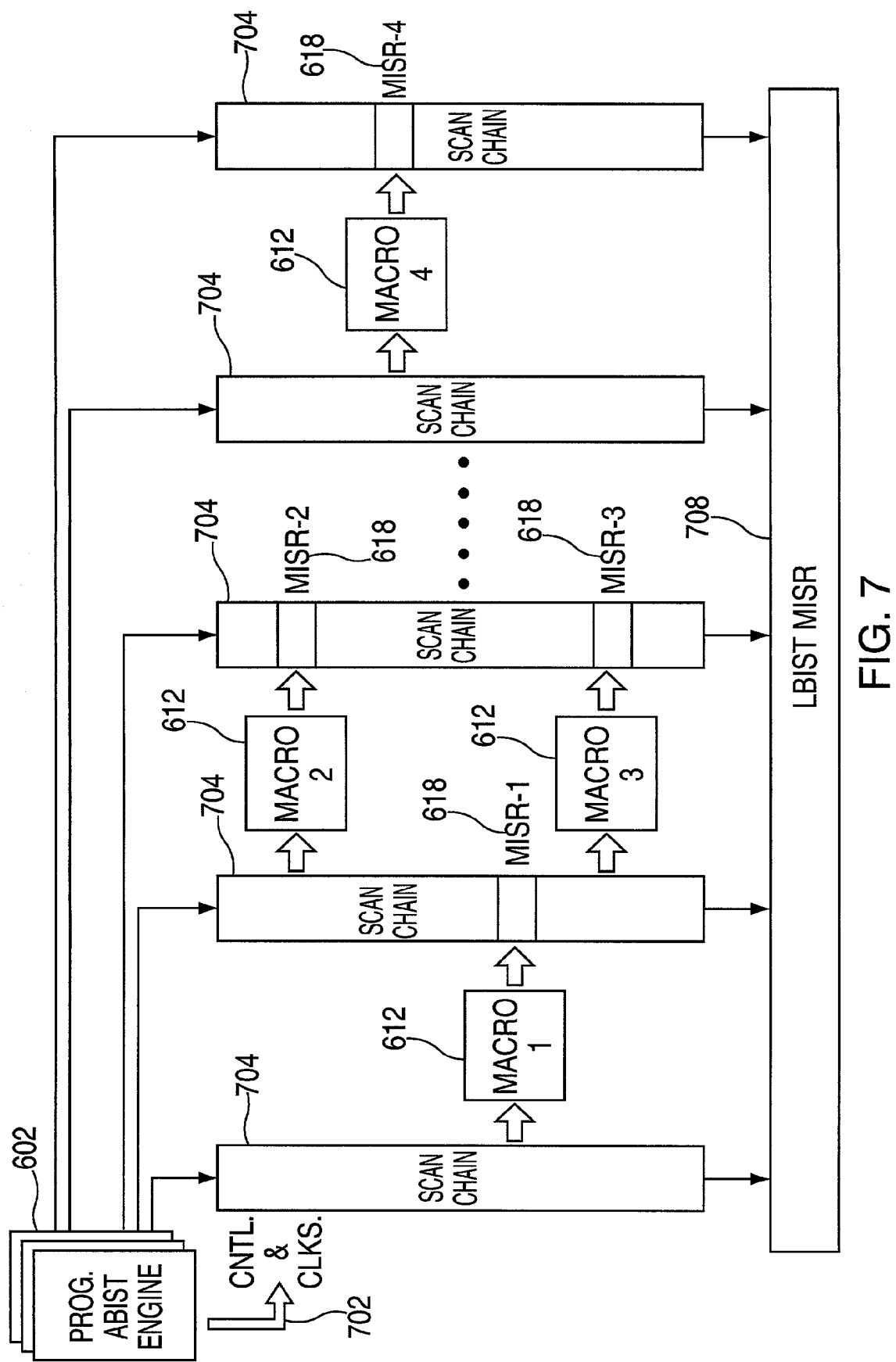
FIG. 7 is a block diagram of an exemplary scanned ABIST test configuration utilizing an LIBIST configuration to detect common failing signatures.

FIG. 7 is a block diagram of an exemplary scanned MISR ABIST test configuration utilizing a LBIST configuration to detect common failing signatures. This implementation uses existing LBIST hardware, as depicted in FIG. 1, and is applicable to arrays using a scanned MISR ABIST. Controls and clocks 702 are generated by the ABIST engine 602. After the array test is complete and all MISRs 618 are loaded, the scan chain 704 is reconfigured into LBIST mode. An alternate embodiment does not wait for the array test to be complete and signatures are being continuously shifted into the MISRs (eg., on every cycle) while the test is running. In this mode, the scan chain 704 is configured as a number of parallel sub-chains. An LBIST scan cycle is then run, which scans all the sub-chains into the LBIST MISR 708. In the exemplary embodiment depicted in FIG. 7, all latches in the LBIST sub-chains should be initialized to fixed values (eg., no "x" states). If the operation of the scanned ABIST engine leaves any LBIST latch in an unknown ("x") state, then selective gating of stumps chains or latches in those chains will be required to remove the unknown ("x") states from the signature generation. The exemplary embodiment depicted in FIG. 7, utilizes LBIST as an example. Other embodiments are possible which are not LBIST compatible and the output responses are compressed into a MISR. In the exemplary embodiment depicted in FIG. 7, once the sub-chains have been scanned into the LBIST MISR the algorithm described below in reference to FIG. 8 is performed in order to identify common failures.

FIG. 8 is a flowchart of an exemplary process for finding common failing signatures in ABIST devices. FIG. 8 is the same as FIG. 3 except for step 806. The testing process is initiated at step 800. The ABIST test of the integrated circuit is performed at step 804. In an exemplary embodiment, the test patterns are divided into a number of partitions, similar to the LBIST process described in reference to FIG. 3, and the signature is checked at the end of each partition. In an exemplary embodiment, the tests are ordered such that the smallest partitions are tested first. At step 806, it is determined whether the device under test has failed. In an exemplary embodiment, device failure is determined by applying the test pattern partitions in order and then comparing each resulting signature to a reference signature. For example, a first test pattern partition is applied to the chip under test and a first signature is compared to a first reference signature. Then, a second test pattern partition is applied to the device under test and a second signature is compared to a second reference signature. In an exemplary embodiment, when a signature mismatch occurs for a test, the failing signature is saved in a record of a test database 808 containing reference failing signatures. Similar to the LBIST process described in reference to FIG. 3, the failing record can be indexed by a unique identifier for the chip (e.g., an electronic chip ID). Additional data about the failing record can be stored including signature data, a test pattern identifier, a common failure signature flag, a bit address and a word address. Practical considerations, such as the size of the database may limit the number of bits of the signature that are saved. A limited signature is acceptable as long as the probability of aliasing is small. In many cases, ten or fewer bits may be saved of the MISR. Saving mismatches from the expected MISR is also acceptable, because common mode failures can also be extracted from that data. In another exemplary embodiment, only the first failing signature within each partition may be saved in order to reduce the amount of storage required.

The more conditions under which this partitioned test is run, the more potential for determining marginal or ignorable common fails stored in database 810. Such conditions can include but are not limited to high and low specified voltage corners and running the test at DC or at speed. Other conditions that can be considered include high and low temperature. An identifier in the database record 808 to identify the failing test condition is useful but not necessary.

If failing signatures are found at step 806, flow proceeds to step 812 where the process determines the existence of common failing signatures that indicate a nonrandom source of failure such as process defects. In an exemplary embodiment, failing signatures for the chip under test are compared against all reference failing signatures in database 808. Only signatures of identical test patterns may be compared. For example, if an ABIST test of 32 patterns ("ABIST_32") fails, it is to be compared against the identical 32 pattern long ABIST test signature for other chips. The signature may be compared across environmental conditions but caution must be exercised or a common fail may not be found. For example, if a chip fails ABIST_32 at low voltage and it is only compared with other chips failing ABIST_32 at low voltage, then a common failing signature may not be found. It may be that there is a chip that failed with the same signature at nominal voltage and another characteristic (intrinsic chip speed for example) made it pass at low voltage. Queries should be broad, across all environmental conditions for the same test patterns.

Chips that do not fail the ABIST tests will generally also be tested at step 820 for other manufacturing defects. If they fail these subsequent tests 820 they are generally discarded at step 816. Prior to being discarded, a description of the manufacturing defect may be maintained for overall evaluation of the manufacturing process. After discarding a chip, the testing can begin again on another chip at 818 if one is available. Chips that pass the manufacturing tests can be saved as shown at 822.

At step 812, if there are no common failing signatures, flow proceeds to step 816 and the device under test is discarded as being a failing chip. If a failing signature of one chip matches a failing signature of another chip that indicates that some non-random failure mechanism is taking place. Flow proceeds to step 815 where the device under test can be saved for diagnostics or discarded. Even if the incidence is low, there is a concern because whatever caused the problem may become much worse when the next semiconductor lot is tested or if the test specifications change slightly. One of the concerns during semiconductor testing is circuit marginality. Circuit behavior may be marginal at voltage, temperature, or cycle time limits. It is beneficial to identify this behavior quickly so that fixes can get into the next release of the chip. Yield may be acceptable for one lot, but unacceptably low for the next lot.

Some signatures may be common but indicate either a catastrophic problem or normal behavior. These signatures are stored in a database 810 of ignorable failing signatures and should be treated separately and not usually considered part of the common mode fail search. An example of a catastrophic problem would be poor electrical contact to a chip I/O required for ABIST. Another would be the ABIST state machine never starts and the signature is trivial. Normal behavior may be a defect free response caused by a circuit that failed in an expected manner. An example of this would be caused by running ABIST at shorter and shorter cycle times exceeding the chip specification until a fail occurs. This "fail" may be caused by predicted timing critical paths on the chip. Since chips of a given type are all designed the same, it is to be expected that many chips will have the same critical path failing, resulting in the same failing signature. As a minimum, common failing signatures should be identified so that the yield loss due to them can be quantified. It is recommended that chips with common fails be saved for further diagnostic work to determine the root cause and identify fixes. Using an embodiment of the present invention, chips that have common logic problems can be easily identified. The relative yield loss attributable to each common problem can be calculated and the chips set aside for further diagnostic analysis to determine root cause and fix.

The exemplary embodiment of the present invention depicted in FIG. 8 is based on signature analysis that identifies that a fail has occurred that has not been seen before. As an example, this determination may be made off-line after a device is tested and the signature is compared with signatures in a stored database. In addition, the part may be marked on a wafer pick map to hold for diagnostics.

The present invention can include embodiments in the form of computer-implemented processes and apparatuses for practicing those processes. That is, a processor (such as the LBIST or ABIST controller) can execute a program stored in a storage medium to perform the process described in FIG. 3 and FIG. 8. The present invention can also include embodiments in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also include embodiments in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for testing an integrated circuit comprising:
generating a test pattern;
generating a reference signature corresponding to said test pattern;

executing an integrated circuit test in response to said test pattern;

generating a result signature in response to data output from said executing an integrated circuit test;

comparing said result signature to said reference signature;

creating a current failing signature in response to a mismatch between said result signature and said reference signature, wherein said current failing signature is a copy of said result signature; and determining if the current failing signature matches a previous failing signature.

2. The method of claim 1 wherein said determining includes:

comparing said current failing signature to said previous failing signature, wherein said previous failing signature corresponds to said test pattern;

denoting said current failing signature and said previous failing signature as common failure signatures in response to a match between said current failing signature and said previous failing signature; and storing said current failing signature and said previous failing signature.

3. The method of claim 2 further including retrieving said previous failing signature from a database.

4. The method of claim 2 wherein said storing said previous failing signature includes writing said previous failing signature to a database.

5. The method of claim 2 wherein said storing said current failing signature includes writing said current failing signature to a database.

6. The method of claim 2 further including sending a notification in response to said denoting said current failing signature and said previous failing signature as common failure signatures.

7. The method of claim 2 wherein said previous failing signature includes signature data and a common failure signature flag.

8. The method of claim 7 wherein said signature data includes a test pattern identifier.

9. The method of claim 7 wherein said signature data includes a unique integrated circuit identifier corresponding to the integrated circuit.

10. The method of claim 1 wherein said current failing signature includes signature data and a common failure signature flag.

11. The method of claim 10 wherein said signature data includes a bit address and a word address.

12. The method of claim 10 wherein said signature data includes a test pattern identifier.

13. The method of claim 10 wherein said signature data includes a unique integrated circuit identifier corresponding to the integrated circuit.

14. The method of claim 1 wherein said generating a result signature is performed using a subset of said data output from said executing the integrated circuit test.

15. The method of claim 14 wherein said subset is determined using selective signature generation.

16. The method of claim 1 wherein said test pattern includes a bit address, a word address and a data input.

17. A system for testing an integrated circuit comprising:

a test pattern generator for generating a test pattern;

a reference signature generator for generating a reference signature corresponding to said test pattern;

a controller for executing a test of the integrated circuit in response to said test pattern;

a signature register for generating a result signature in response to data output from said executing a test;

a compare device for comparing said result signature to said reference signature; and an error analysis processor for determining if the current failing signature matches a previous failing signature in response to a mismatch between said result signature and said reference signature.

18. The system of claim 17 wherein:

said system is a dedicated ABIST system;

said signature register includes a plurality of array critical busses and a MISR corresponding to each said array critical bus; and said system further comprises:

an array to be tested by said controller; and a clock for clocking data into each said MISR.

19. The system of claim 18 wherein said clocking is performed once for every test pattern.

20. The system of claim 18 wherein said clocking is performed once for each partition.

21. The system of claim 18 wherein said clocking is performed in response to said mismatch between said result signature and said reference signature.

22. The system of claim 18 wherein said array critical busses include a data bus and an address bus.

23. The system of claim 18 wherein said array critical busses include a bit address bus, a word address bus and a data bus.

24. The system of claim 18 wherein input to said signature register includes a subset of said data output from said executing a test.

25. The system of claim 24 wherein said subset is determined using selective signature generation.

26. The system of claim 17 wherein said signature register is an LBIST MISR.

27. The system of claim 17 wherein:

said system is a scanned ABIST system;

said system further comprises:

an array to be tested by said controller;

an input scan chain including said test pattern for input to said executing a test;

an output scan chain including a scan MISR corresponding to said array, wherein said data output from said executing a test is input to said scan MISR; and a clock for clocking data into said scan MISR;

said signature register is said scan MISR; and said compare device is a LBIST MISR.

28. The system of claim 27 wherein said input scan chain is configured as a LBIST sub-chain and said output scan chain is configured as a LBIST sub-chain.

29. The system of claim 28 further including an LBIST scan cycle generator for scanning said output scan chain into said LBIST MISR.

30. The system of claim 28 wherein said input scan chain is utilized as both a said output scan chain and a said input scan chain.

31. The system of claim 28 wherein said output scan chain is utilized as both a said input scan chain and a said output scan chain.

32. The system of claim 27 wherein said clocking is performed once for every test pattern.

33. The system of claim 27 wherein said clocking is performed once for each partition.

34. The system of claim 27 wherein said clocking is performed in response to said mismatch between said result signature and said reference signature.

35. The system of claim 27 wherein said scan MISR is said LBIST MISR.

36. A storage medium encoded with machine-readable computer program code for testing an integrated circuit, the storage medium including instructions for causing a processor to implement a method comprising:
   generating a test pattern;
   generating a reference signature corresponding to said test pattern;
   executing an integrated circuit test in response to said test pattern;
   generating a result signature in response to data output from said executing an integrated circuit test;
   comparing said result signature to said reference signature;
   creating a current failing signature in response to a mismatch between said result signature and said reference signature, wherein said current failing signature is a copy of said result signature; and
   determining if the current failing signature matches a previous failing signature.

37. The storage medium of claim 36 wherein said determining includes:
   comparing said current failing signature to a previous failing signature, wherein said previous failing signature corresponds to said test pattern;
   denoting said current failing signature and said previous failing signature as common failure signatures in response to a match between said current failing signature and said previous failing signature; and
   storing said current failing signature and said previous failing signature.

* * * * *